(12) United States Patent
Ling et al.

(10) Patent No.: US 9,586,216 B2
(45) Date of Patent: Mar. 7, 2017

(54) CHARGED POWDER SUPPLY DEVICE

(71) Applicant: ACHROLUX INC., Sunnyvale, CA (US)

(72) Inventors: Peiching Ling, Sunnyvale, CA (US); DeZhong Liu, Sunnyvale, CA (US)

(73) Assignee: ACHROLUX INC., Sunnyvale, CA (US)

( * ) Notice: Subject to any disclaimer, the term of this patent is extended or adjusted under 35 U.S.C. 154(b) by 215 days.

(21) Appl. No.: 14/461,507

(22) Filed: Aug. 18, 2014

(65) Prior Publication Data

US 2015/0114288 A1    Apr. 30, 2015

Related U.S. Application Data

(60) Provisional application No. 61/896,169, filed on Oct. 28, 2013.

(51) Int. Cl.
| | |
|---|---|
| *B05B 5/16* | (2006.01) |
| *B05C 19/04* | (2006.01) |
| *H01L 33/44* | (2010.01) |
| *B05B 5/057* | (2006.01) |
| *B05C 19/00* | (2006.01) |
| *B05C 19/02* | (2006.01) |

(52) U.S. Cl.
CPC ............ *B05B 5/1683* (2013.01); *B05B 5/057* (2013.01); *B05B 5/1608* (2013.01); *B05C 19/00* (2013.01); *B05C 19/025* (2013.01); *B05C 19/04* (2013.01); *H01L 33/44* (2013.01); *B05C 19/002* (2013.01); *H01L 2933/0041* (2013.01)

(58) Field of Classification Search
None
See application file for complete search history.

(56) References Cited

U.S. PATENT DOCUMENTS

| | | | | | |
|---|---|---|---|---|---|
| 2,748,018 | A | * | 5/1956 | Miller | B05B 5/057 118/626 |
| 3,197,328 | A | * | 7/1965 | Jung | B01J 8/16 118/423 |
| 3,323,933 | A | * | 6/1967 | Barford | B05B 5/14 118/627 |
| 6,561,628 | B1 | * | 5/2003 | Camis | B41J 2/4155 347/55 |
| 9,168,564 | B1 | * | 10/2015 | Hays | B05D 1/007 |
| 2003/0044524 | A1 | * | 3/2003 | Hoffland | B05C 19/025 427/180 |
| 2004/0083954 | A1 | * | 5/2004 | Nakamura | B05C 3/09 118/400 |

* cited by examiner

*Primary Examiner* — Dah-Wei D Yuan
*Assistant Examiner* — Jethro M Pence
(74) *Attorney, Agent, or Firm* — Amin, Turocy & Watson, LLP

(57) ABSTRACT

A charged powder supply device is disclosed. A plurality of charged powder particles are disposed on an upper side of a carrier and at least an action source is positioned at a lower side of the carrier for acting on the carrier so as to vibrate the charged powder particles on the upper side of the carrier. As such, the vibrated charged powder particles are attached to objects to be coated, such as LEDs, under the effect of an electric field so as to form a powder layer, such as a phosphor layer. Since there are no other external forces that affect the moving direction of the charged powder particles, the powder layer can be uniformly formed on the objects.

11 Claims, 8 Drawing Sheets

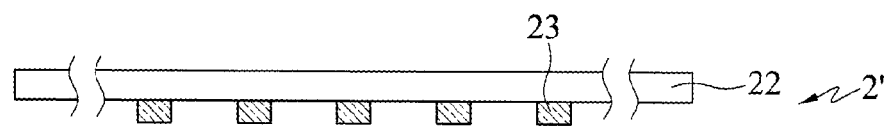
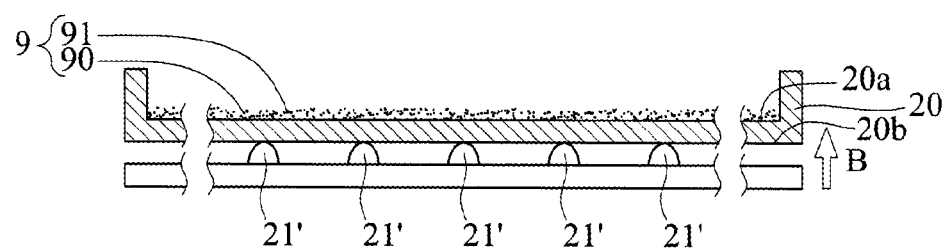
FIG. 2'
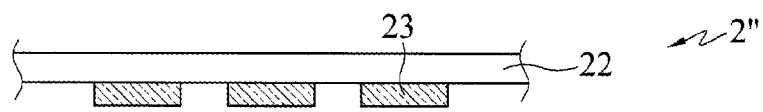
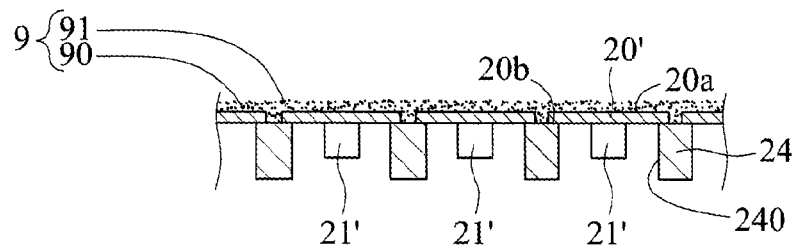
FIG. 2"

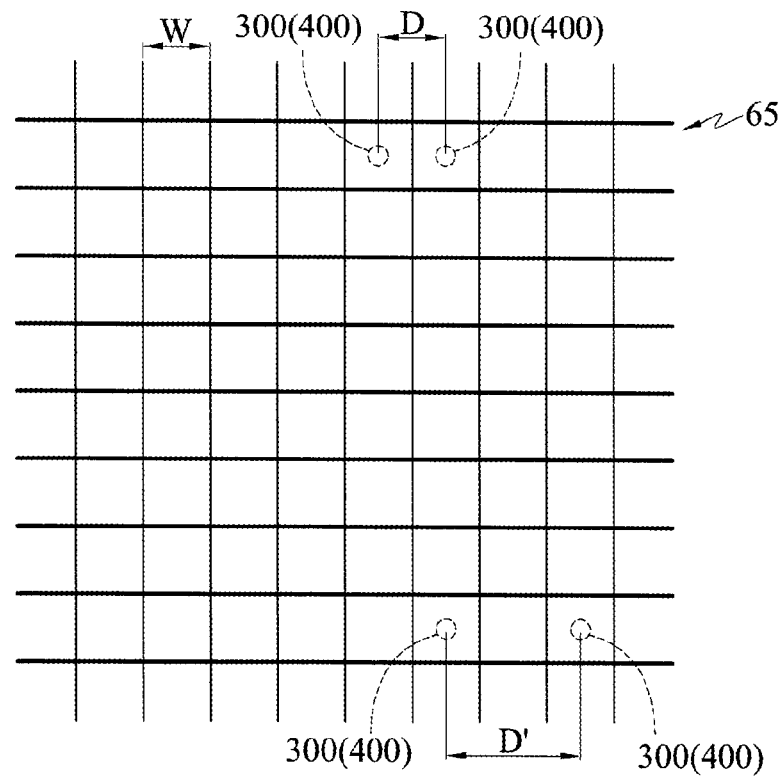
FIG. 6A'
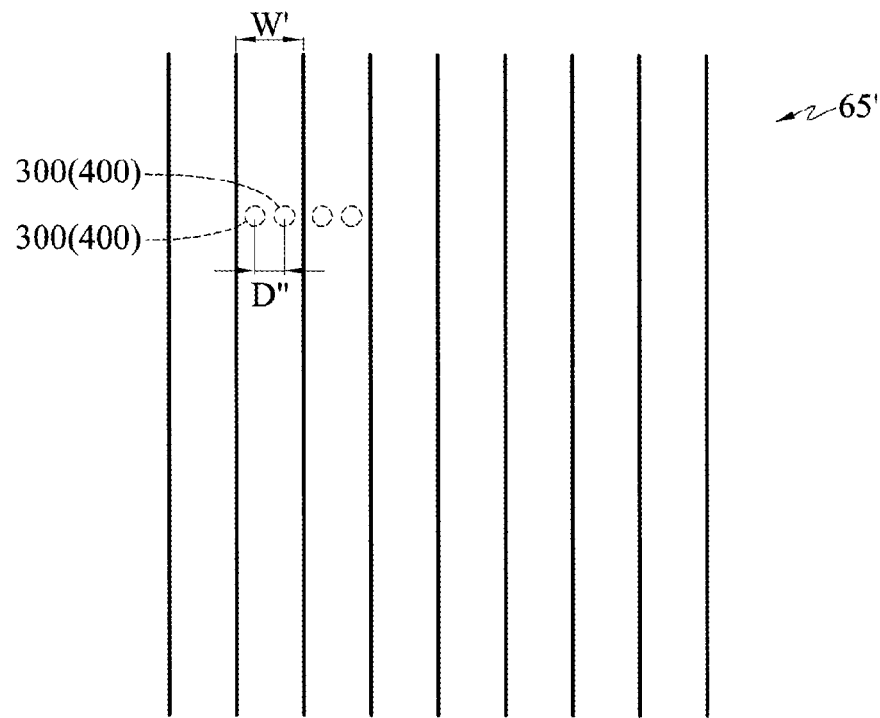
FIG. 6A"

CHARGED POWDER SUPPLY DEVICE

BACKGROUND OF THE INVENTION

1. Field of the Invention

The present invention relates to devices used for forming uniform powder layers on objects, and more particularly, to a charged powder supply device.

2. Description of Related Art

Along with the rapid development of electronic industries, electronic products are becoming lighter, thinner, shorter and smaller and developed towards high performance, high function and high speed.

In a conventional LED fabrication process, phosphor is formed on an object by dispensing or coating. During coating, it is difficult to control the coating amount of phosphor in different areas of the object and consequently the phosphor in different areas often has different thicknesses. Also, the phosphor may be distributed on LEDs by a diffusion process. However, it is difficult to control the diffusion direction of the phosphor. As a result, the LEDs have different amount of phosphor formed thereon.

FIG. 1 shows a conventional coating process in other industries. Referring to FIG. 1, a powder supply device 1 has: a fluidized board 10 having a plurality of micro-holes (not shown), a supply portion 11 disposed below the fluidized board 10, and a receiving member 12 disposed over the fluidized board 10 and having a plurality of objects 13 to be coated. The fluidized board 10 is used for carrying powder 8.

In operation, air is supplied from one side of the fluidized board 10 by the supply portion 11 so as to provide an air flow A to a lower side of the fluidized board 10. The air flow A then passes through the micro-holes of the fluidized board 10 to cause the powder 8 to rise up and be attached to the receiving member 12.

However, since it is difficult to control the direction of the air flow A after it passes through the micro-holes of the fluidized board 10, undirected flows, such as turbulent flows, can easily occur, especially after the air flow A arrives at and then bounces back from the receiving member 12. Consequently, the powder 8 cannot rise up and be distributed uniformly on the receiving member 12. Accordingly, the powder 8 cannot be uniformly attached to the objects 13.

Further, since the micro-holes of the fluidized board 10 have a very small size, some of them may be blocked by the powder 8 in operation and prevent the air flow A from passing through, thereby preventing the powder 8 from being uniformly attached to the receiving member 12.

If the coating process shown in FIG. 1 is applied to the manufacturing process of LEDs, since the air flow A, after passing through the fluidized board 10, cannot flow unidirectionally, the powder 8 will not rise uniformly. As a result, the powder 8 will not be distributed uniformly on the LEDs disposed on the receiving member 12, and the LEDs do not have highly uniform phosphor formed thereon.

Therefore, how to overcome the above-described drawbacks has become urgent.

SUMMARY OF THE INVENTION

In view of the above-described drawbacks, the present invention provides a charged powder supply device, which comprises: a carrier having opposite first and second sides, wherein a plurality of charged powder particles are disposed on the first side of the carrier; and at least an action source positioned at the second side of the carrier for acting on the carrier so as to vibrate the charged powder particles on the first side of the carrier, thereby causing the charged powder particles to leave the first side of the carrier.

In the above-described device, the action force can be in contact with or separated from the second side of the carrier.

In the above-described device, the carrier can have a plurality of uniformly distributed conductive traces or a planar conductor structure having uniformly distributed points formed by metal etching.

The above-described device can further comprise power supplies disposed on the first side of the carrier.

In an embodiment, the carrier can be a power supply for generating an electric field and a corona discharge.

The present invention further provides another charged powder supply device, which comprises: a carrier having opposite first and second sides, a plurality of through holes penetrating the first and second sides, a plurality of balls positioned in the through holes, and a plurality of carrying portions positioned on the first side and respectively covering one ends of the through holes, wherein the carrying portions are used for carrying a plurality of charged powder particles; and at least an action source positioned at the second side of the carrier for acting on the carrier so as to vibrate the charged powder particles on the first side of the carrier, thereby causing the charged powder particles to leave the first side of the carrier.

In the above-described device, the carrier can further have a positioning plate on the second side thereof. Further, the balls can protrude from the positioning plate.

Therefore, the present invention forms a powder layer on objects through the charged powder supply device. That is, the action force acts on the carrier to vibrate the charged powder particles, thereby causing the charged powder particles to leave the carrier so as to be attached to the objects under the effect of an electric field. By vibrating the charged powder particles through the carrier, the present invention can effectively control the action force on each vibrating position of the carrier such that the vibrated charged powder particles on each vibrating position of the carrier have a uniform height. Accordingly, the charged powder particles are uniformly attached to the objects.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

In the following embodiments, an action source 21 provides an action force such as an impact force, a fluid motion, or an acoustic or ultrasonic wave for vibrating charged powder. An object to be coated can be such an LED element.

The present invention provides a vibration source to vibrate charged powder and does not use the conventional air flow force. Under the effect of an electric field on a carrier, the present invention causes vibrated charged powder to be uniformly attached to a receiving member so as to form a uniform powder layer. Preferably, by designing vibration height of the powder, a more uniform powder layer can be formed.

Figure 1:
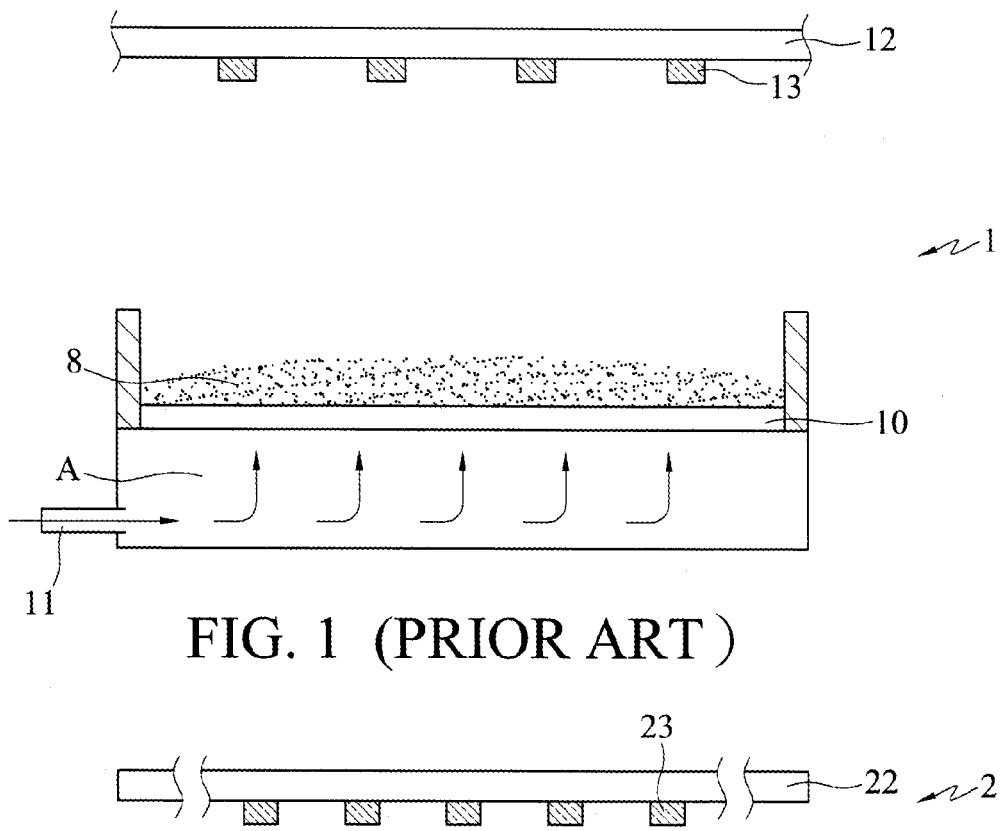
FIG. 1 is a schematic cross-sectional view of a conventional powder supply device.
Figure 2:
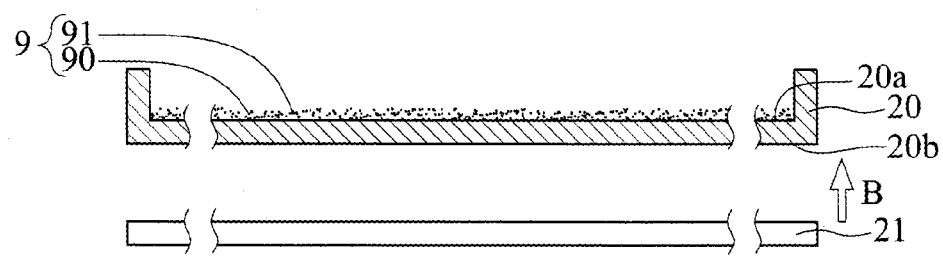
FIGS. 2, 2' and 2" are schematic cross-sectional views of a charged powder supply device according to a first embodiment of the present invention.

FIGS. 2, 2' and 2" are schematic cross-sectional views showing charged powder supply devices 2, 2', 2" according to a first embodiment of the present invention.

Referring to FIG. 2, the charged powder supply device 2 has a carrier 20, an action source 21 and a receiving member 22.

The carrier 20 has a first side 20a with powder 9 disposed thereon and a second side 20b opposite to the first side 20a. The powder 9 has a plurality of powder particles 90 and an adhesive material 91. For example, the adhesive material 91 is in the form of solid particles. The adhesive material 91 is adhered to or separated from the powder particles 90 or encapsulates the powder particles 90. The powder particles 90 can be phosphor, nano tube, quantum dot, carbon tube or graphene particles.

The action source 21 is positioned at the second side 20b of the carrier 20 and separated from the second side 20b and used for acting on the carrier 20 so as to vibrate the powder particles 90 and the adhesive material 91 on the first side 20a of the carrier 20. The adhesive material 91 is in the form of solid particles. The adhesive material 91 can be adhered to or separated from the powder particles 90 or encapsulates the powder particles 90.

The receiving member 22 is positioned over and separated from the first side 20a of the carrier 20 and used for receiving the vibrated charged powder particles 90 and the adhesive material 91. The receiving member 22 can carry a plurality of objects 23 to be coated, such as LED elements, so as for the charged powder particles 90 and the adhesive material 91 to be formed thereon.

Referring to FIG. 2', the charged powder supply device 2' can have a plurality of action sources 21' and the action sources 21' can be in contact with the second side 20b of the carrier 20. The action sources 21' can be bumps or water columns to provide impact forces or fluid motions.

During operation of the charged powder supply device 2, 2', the action source(s) 21, 21' is started to provide an action force to the carrier 20 in a direction B to vibrate the carrier 20, thereby causing vibration of the charged powder particles 90 and the adhesive material 91 on the first side 20a of the carrier 20. Further, under the effect of an electric field, the vibrated charged powder particles 90 and the adhesive material 91 leave the first side 20a of the carrier 20 and rise up to the receiving member 22. As such, the charged powder particles 90 are stuck to the objects through the adhesive material 91.

Therefore, after the action source 21 vibrates the carrier 20 to cause vibration of the charged powder particles 90 and the adhesive material 91, the charged powder particles 90 and the adhesive material 91 are guided by the electric field so as to be stuck to the objects. That is, there are no other external forces (for example, conventional air flow forces) that affect the vertical upward force between the carrier 20 and the receiving member 22. Hence, the direction of the charged powder particles 90 and the adhesive material 91 can be effectively controlled such that the charged powder particles 90 and the adhesive material 91 on each vibrating position have a uniform height and the powder particles 90 are uniformly stuck to the objects 23.

Referring to FIG. 2", the charged powder supply device 2" can further have a support member 24. The support member 24 has a plurality of through holes 240 formed corresponding in position to a plurality of carriers 20' so as to be covered by the carriers 20', respectively. Alternatively, a single carrier 20' can be provided to cover all the through holes 240. As such, the action forces coming from the action sources 21' can be transmitted to the carriers 20' through the through holes 240 without interfering with each other so as to apply uniform forces on the carriers 20'. Further, the action sources 21' can be received in the through holes 240 of the support member 24. In addition, the carriers 20' can be closely bonded with the support member 24.

Figure 3:
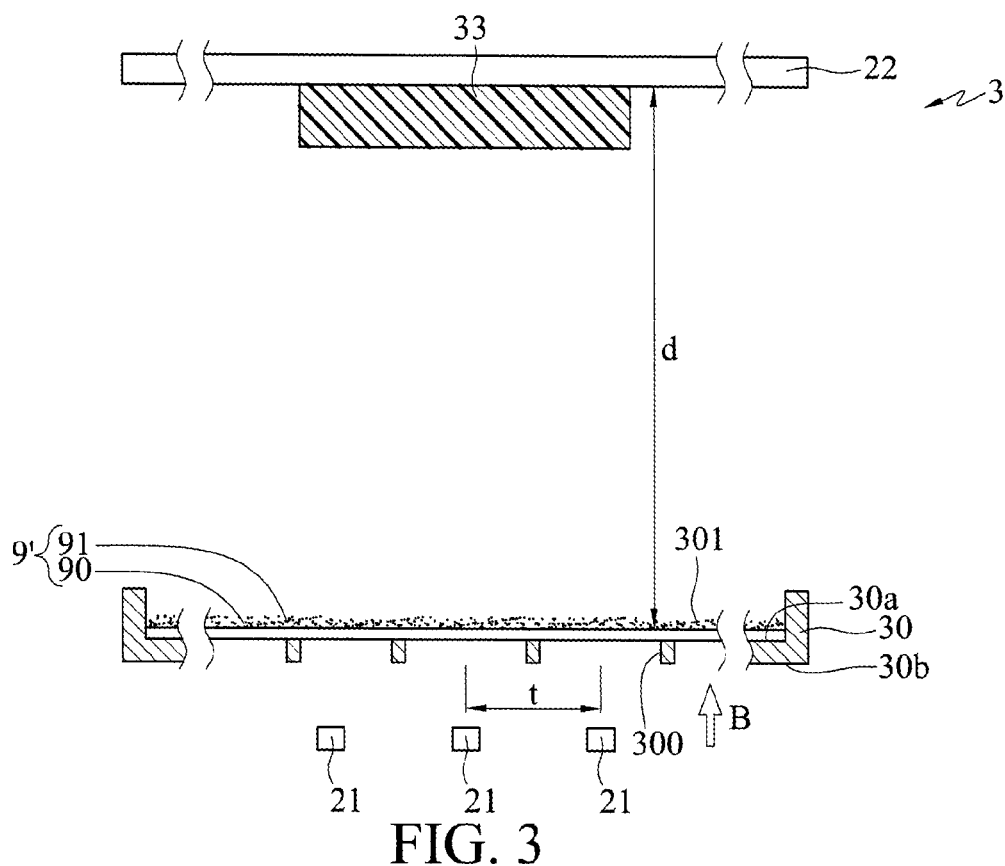
FIGS. 3 and 3' are schematic cross-sectional and partial upper views of a charged powder supply device according to a second embodiment of the present invention.
Figure 3:
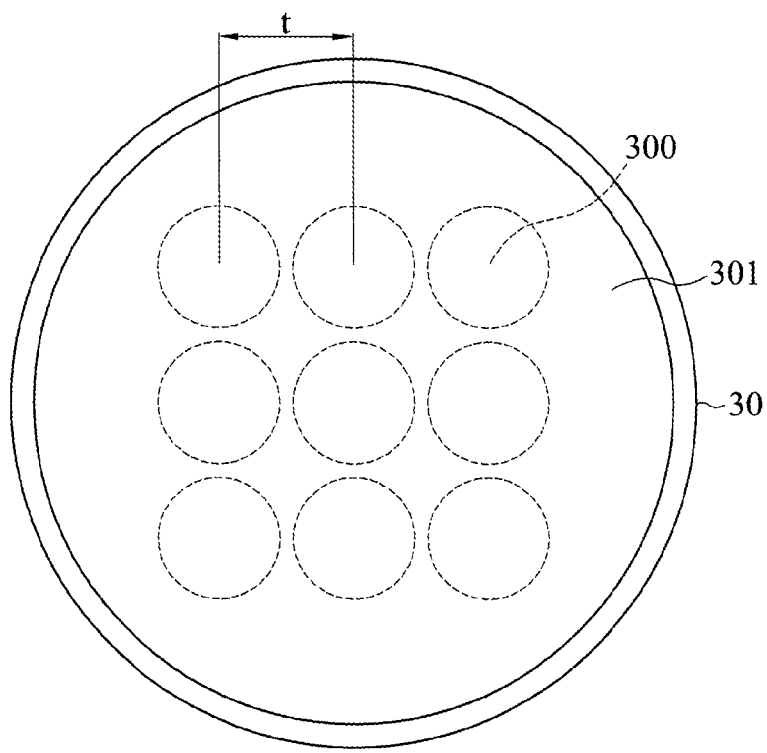

FIGS. 3 and 3' are schematic cross-sectional and partial upper views of a charged powder supply device 3 according to a second embodiment of the present invention. The present embodiment differs from the first embodiment in the design of the carrier 30 and the object 33.

Referring to FIGS. 3 and 3', the carrier 30 has a plurality of through holes 300 penetrating the first side 30a and the second side 30b, and a carrying portion 301 positioned on the first side 30a and covering one ends of the through holes 300. The carrying portion 301 is used for carrying the powder 9'. The action sources 21 act on the carrying portion 301 through the through holes 300 so as to vibrate the powder particles 90 and the adhesive material 91. The adhesive material 91 is in the form of solid particles. The adhesive material 91 can be attached to or separated from the powder particles 90 or encapsulate the powder particles 90.

In the present embodiment, the carrying portion 301 is a film or a plate. The material and thickness of the carrying portion 301 are suited to cause vibration of the powder particles 90 and the adhesive material 91 on the carrying portion 301.

Further, the distance d formed between the receiving member 22 and the first side 30a of the carrier 30 is greater than the distance t between any two adjacent through holes 300. Preferably, the distance d is greater than five times the distance t, i.e, d>5t.

Furthermore, a large-sized object 33 of a large size, such as a vehicle component, can be disposed on the receiving member 22.

In addition, the carrying portion 301 is closely bonded with the carrier 30.

During operation of the charged powder supply device 3, the action sources 21 are started to provide action forces in the through holes 300 in a direction B to vibrate the carrying portion 301, thereby causing vibration of the charged powder particles 90 and the adhesive material 91 on the carrying portion 301. Further, under the effect of an electric field, the vibrated charged powder particles 90 and the adhesive material 91 leave the carrying portion 301 and rise up to the receiving member 22. As such, the charged powder particles 90 are stuck to the object 33 through the adhesive material 91.

Therefore, after the action sources 21 vibrates the carrying portion 301 to cause vibration of the charged powder particles 90 and the adhesive material 91, the charged powder particles 90 and the adhesive material 91 are guided by the electric field so as to be stuck to the object 33. Hence, the direction of the charged powder particles 90 and the adhesive material 91 can be effectively controlled to ensure the uniformity of the charged powder particles 90 on the object 33.

Figure 4A:
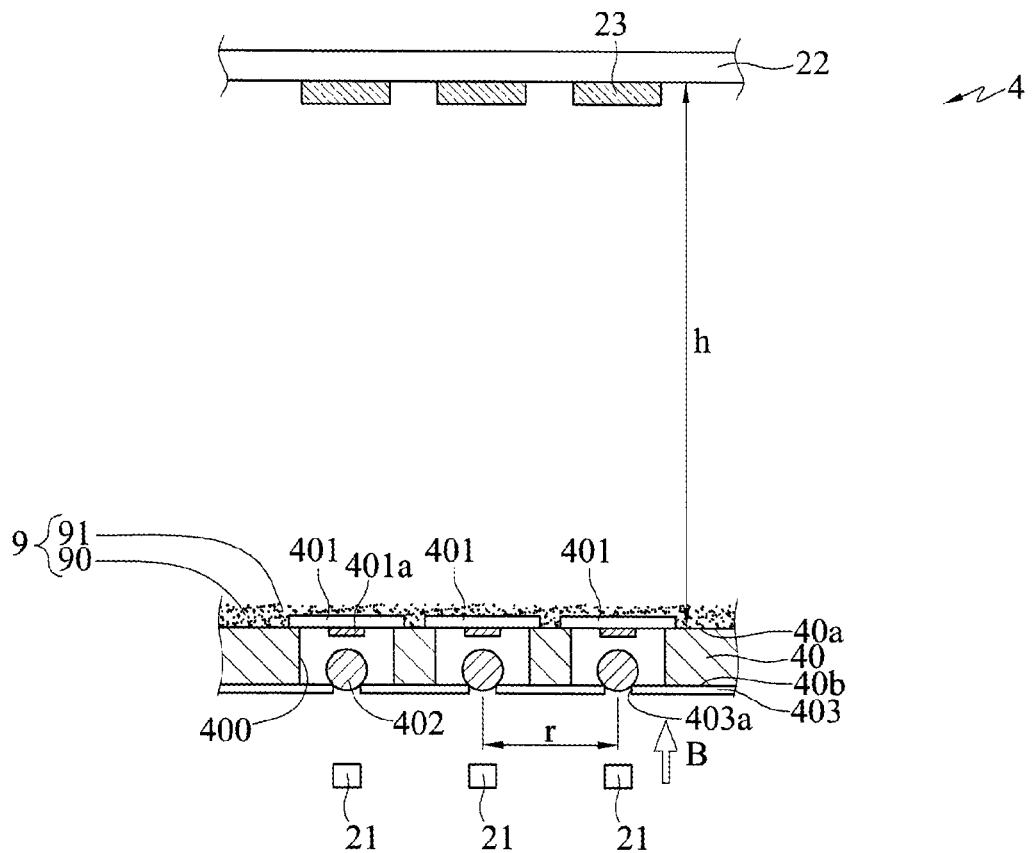
FIGS. 4A to 4C are schematic cross-sectional views of a charged powder supply device according to a third embodiment of the present invention, wherein FIG. 4A' is a partial upper view of FIG. 4A.
Figure 4A:
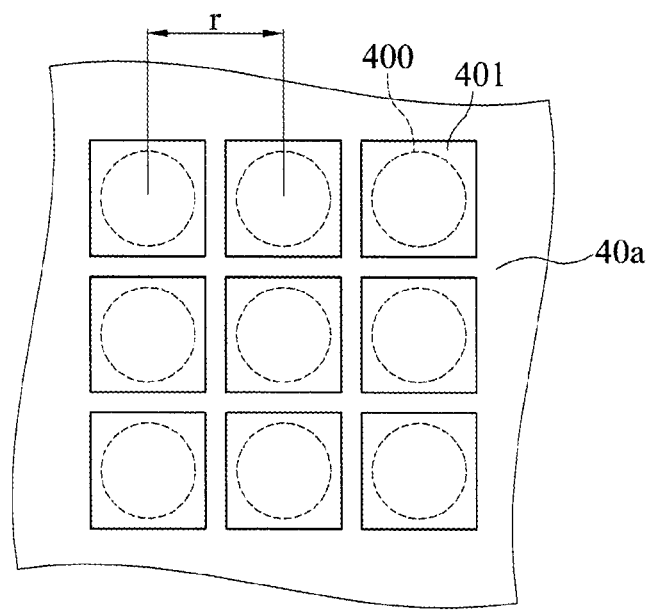
Figure 4B:
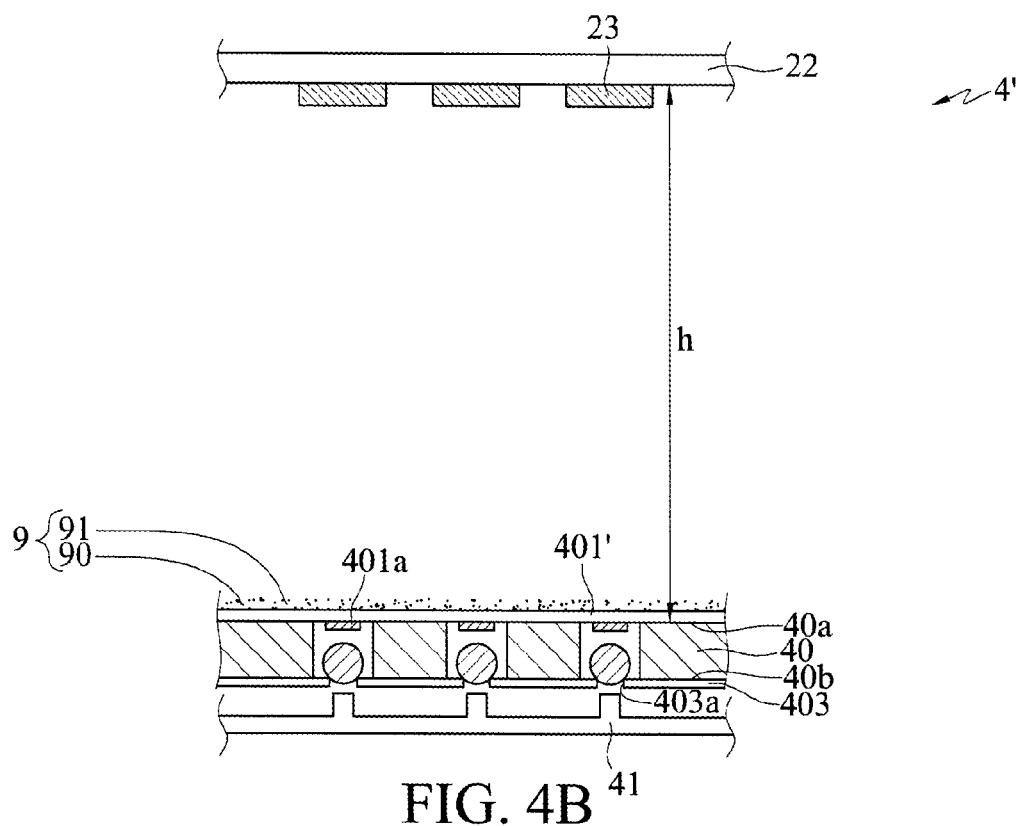
Figure 4C:
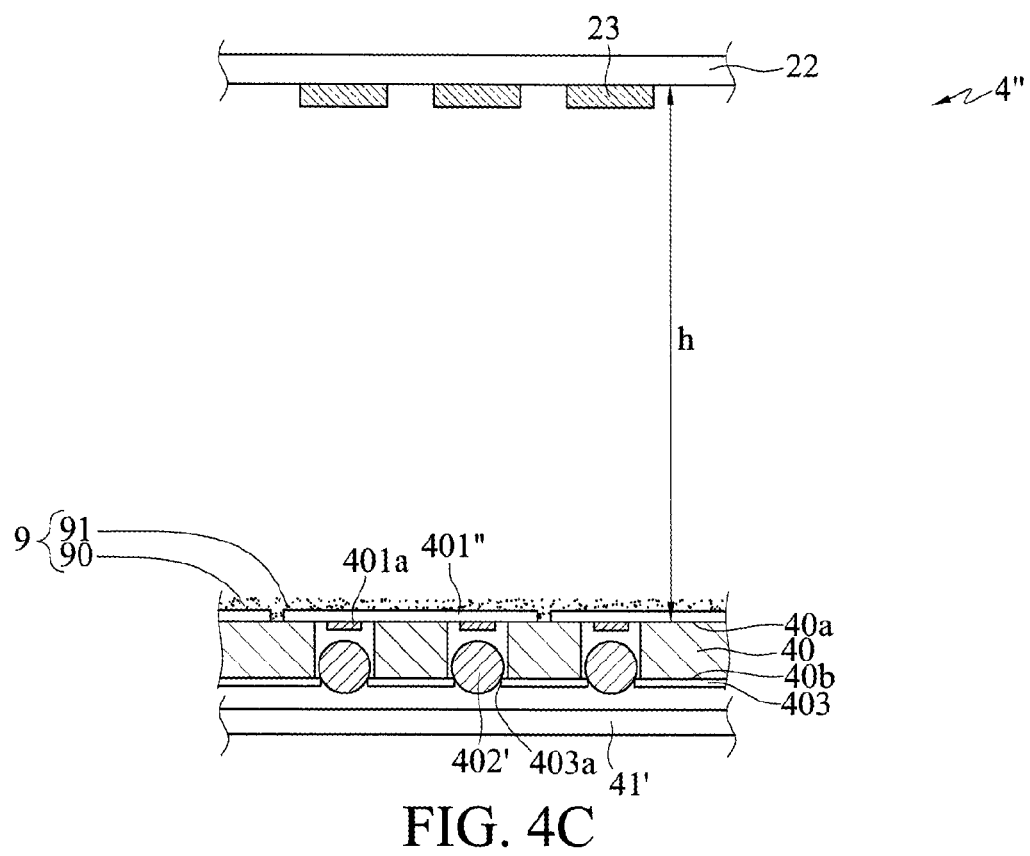

FIGS. 4A to 4C are schematic cross-sectional views showing charged powder supply devices 4, 4', 4" according to a third embodiment of the present invention. The present embodiment differs from the second embodiment in the design of the carrier 40.

Referring to FIGS. 4A and 4A', the carrier 40 has a plurality of through holes 400 penetrating the first side 40$a$ and the second side 40$b$, a plurality of balls 402 positioned in the through holes 400, and a plurality of carrying portions 401 positioned on the first side 40$a$ of the carrier 40 and respectively covering one ends of the through holes 400. The carrying portions 401 are used for carrying the powder 9. The balls 402 are exposed from the second side 40$b$ of the carrier 40. The action sources 21 provide impact forces on the carrying portions 401 through the balls 402 so as to vibrate the charged powder particles 90 and the adhesive material 91. The adhesive material 91 is in the form of solid particles. The adhesive material 91 can be attached to or separated from the powder particles 90 or encapsulate the powder particles 90.

In the present embodiment, the carrying portions 401 are separated films or plates. The material and thickness of the carrying portions 401 are suited to cause vibration of the powder particles 90 and the adhesive material 91 on the carrying portions 401.

Further, the distance h between the receiving member 22 and the first side 40$a$ of the carrier 40 is grater than the distance r between any two adjacent through holes 400. Preferably, the distance h is greater than five times the distance r, i.e., h>5r, thereby achieving a preferred uniformity of the powder particles 90 on the objects.

Furthermore, each of the carrying portions 401 has a pad 401$a$ positioned in the corresponding through hole 400. By impacting the pads 401 with the balls 402, the powder particles 90 and the adhesive material 91 on the carrying portions 401 are vibrated. The pads 401 can be made of plastic or metal. In another embodiment, the pads 401$a$ can be positioned over the carrying portions 401.

In addition, the carrier 40 has a positioning plate 403 on the second side 40$b$ thereof for receiving the balls 402 in the through holes 400. The balls 402 can have a ball shape or can be any blocks having a symmetrical shape. The positioning plate 403 has a plurality of through holes 403$a$ corresponding in position to the through holes 400 of the carrier 40 and having a width less than the diameter of the balls 402. Supported by the positioning plate 403, the balls 402 can be received in the through holes 400 so as not to fall out of the through holes 400. Further, each of the balls 402 is partially exposed from the second side 40$b$ through the corresponding through hole 403$a$ of the positioning plate 402. Therefore, the action sources 21 act on the balls 402 through the through holes 403$a$ of the positioning plate 403 so as to impact the carrying portions 401 (or the pads 401$a$). In addition, the positioning plate 403 supports the balls 402 at the same position and in the same direction so as to ensure that the carrying portions 401 are impacted and receive the action force at the same position.

During operation of the charged powder supply device 4, the action sources 21 are started to provide action forces to the balls 402 in a direction B so as to cause the balls 402 to rise and impact the carrying portions 401 (or the pads 401$a$), thereby vibrating the charged powder particles 90 and the adhesive material 91 on the carrying portions 401. Further, under the effect of an electric field, the vibrated charged powder particles 90 and the adhesive material 91 leave the carrying portions 401 and rise up to the receiving member 22. As such, the charged powder particles 90 are stuck to the objects 33 through the adhesive material 91.

Therefore, after the action sources 21 vibrate the carrying portions 401 so as to cause vibration of the charged powder particles 90 and the adhesive material 91, the charged powder particles 90 and the adhesive material 91 are guided by the electric field so as to be stuck to the objects 23. Hence, the direction of the charged powder particles 90 and the adhesive material 91 can be effectively controlled to ensure the uniformity of the charged powder particles 90 on the objects 23.

Referring to FIG. 4B, the carrying portion 401' is in the form of a continuous film or plate. Further, each of the action sources 41 has an abutting structure for impacting the corresponding ball 402, thereby providing a preferred impact force to the ball 402.

Referring to FIG. 4C, the action source 41' is a flat board and the balls 402' protrude from the through holes 403$a$ of the positioning plate 403 such that the action source 41' can effectively act on the middle portions of the balls 402'. Therefore, the carrying portions 401" can be impacted by the balls 402' at preferred positions so as to cause the powder particles 90 and the adhesive material 91 to move upward vertically and ensure uniformity of the powder particles 90 on the objects 23.

Further, different from FIG. 4A in which each of the carrying portions 401 covers one through hole 400, each of the carrying portions 401" of FIG. 4C covers a plurality of through holes 400.

Figure 5:
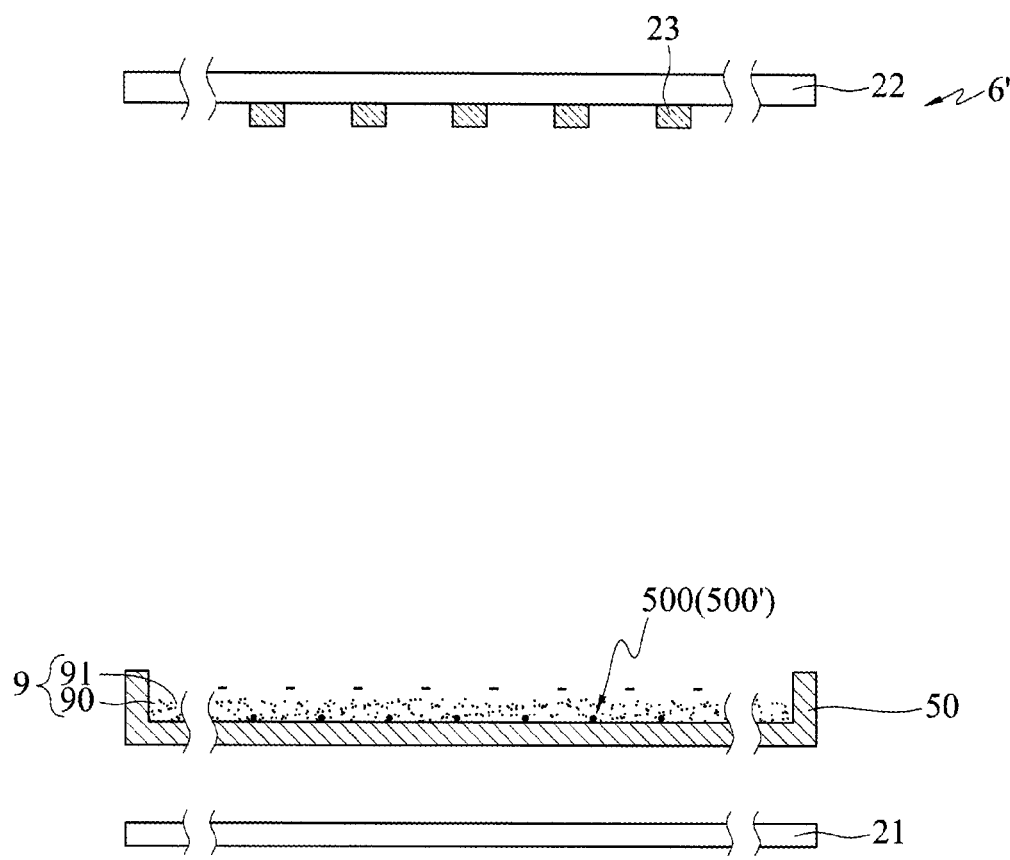
FIG. 5 is a schematic cross-sectional view of a charged powder supply device having power supplies disposed on the carrier thereof according to the present invention.

FIG. 5 is a schematic cross-sectional view of a charged powder supply device having power supplies disposed on the carrier 50 thereof according to the present invention.

Referring to FIG. 5, a plurality of uniformly distributed conductive traces 500 or a planar conductor structure 500' having a plurality of uniformly distributed points is formed on the carrier 50 by metal etching. The conductive traces 500 or planar conductor structure 500' can be arranged in parallel or crossed to form a grid pattern.

During operation of the charged powder supply device 5, a negative DC high voltage is applied on the carrier 50 to generate an electric field and generate a corona discharge through the uniformly distributed conductive traces 500 or points to negatively charge the powder particles 90 and the adhesive material 91 (denoted by a minus sign in FIG. 5). The adhesive material 91 is in the form of solid particles. The adhesive material 91 can be attached to or separated from the powder particles 90 or encapsulate the powder particles 90. A uniform electric field is formed between the carrier 50 and the receiving member 22 first and then the action source 21 is started to vibrate the charged powder particles 90 and the adhesive material 91. As such, the sticking of the charged powder particles 90 and the adhesive material 91 to the objects 23 is speeded up under the effect of the electric field.

Therefore, after the action source 21 vibrates the carrier 50 so as to cause vibration of the charged powder particles 90 and the adhesive material 91, the charged powder particles 90 and the adhesive material 91 are guided and attracted to the objects 23 by the electric field. That is, the vertical upward force (electric attraction) between the carrier 50 and the receiving member 22 is enhanced. Hence, the direction of the charged powder particles 90 and the adhesive material 91 can be effectively controlled to ensure the uniformity of the charged powder particles 90 on the objects 23.

In other embodiment, the carrier 50 can be positively charged.

Figure 6A:
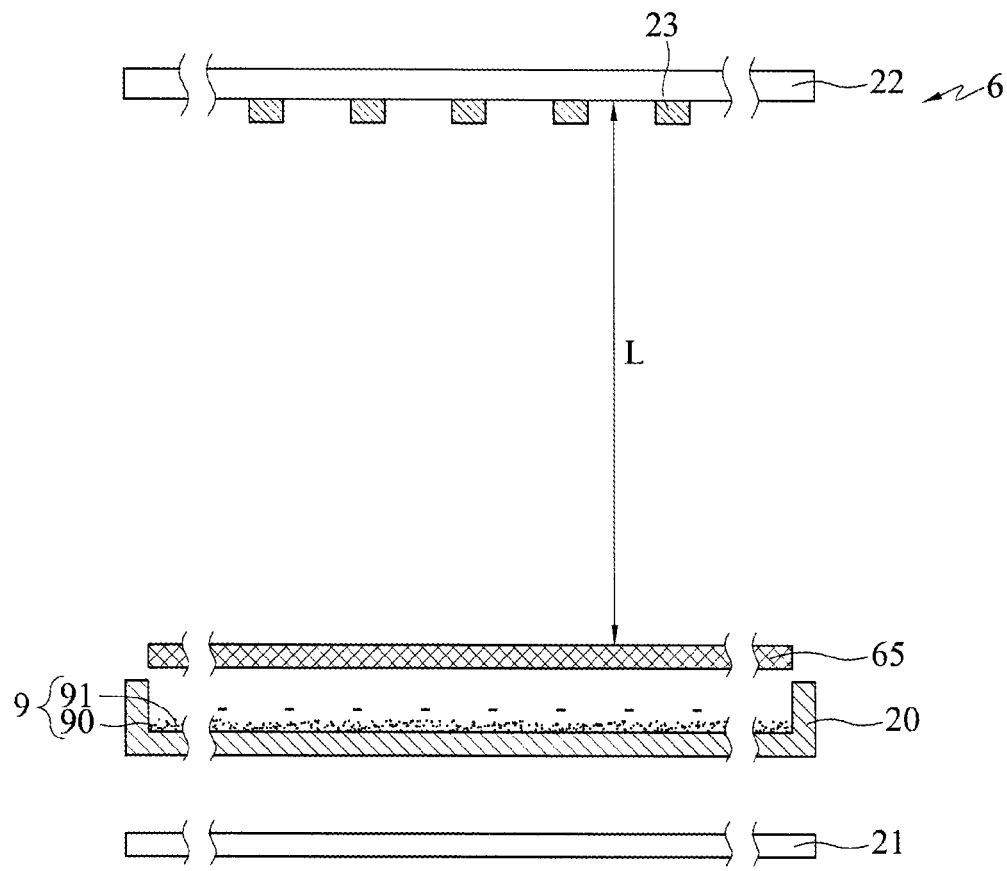
FIGS. 6A and 6B are schematic cross-sectional views showing a charged powder supply device according to a fourth embodiment of the present invention, wherein FIGS. 6A' and 6A" are partial upper views of FIG. 6A.
Figure 6B:
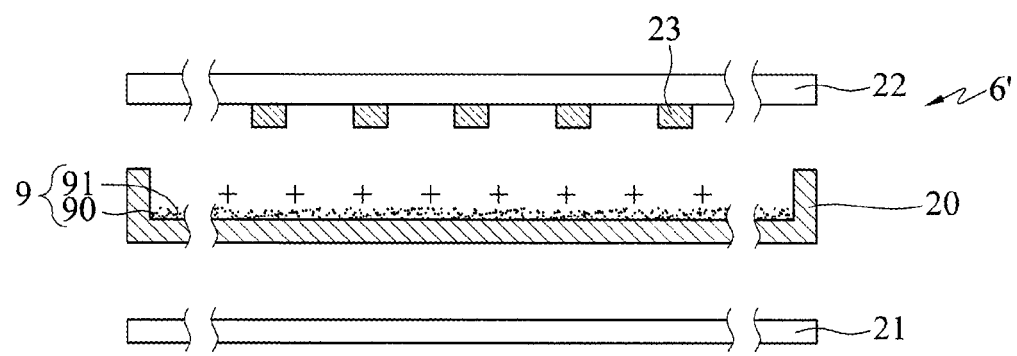

FIGS. 6A and 6B are schematic cross-sectional views of charged powder supply devices 6, 6' according to a fourth embodiment of the present invention.

Referring to FIG. 6A, a plurality of power supplies 65 are disposed at the first side 20a of the carrier 20 for providing charges to the carrier 20, thereby generating a uniform electric field between the carrier 20 and the receiving member 22. Further, as described above, the powder particles 90 and the adhesive material 91 are negatively charged by a corona discharge (denoted by a minus sign in the drawing). The adhesive material 91 is in the form of solid particles. The adhesive material 91 can be attached to or separated from the powder particles 90 or encapsulate the powder particles 90. In other embodiments, the powder particles 90 and the adhesive material 91 can be positively charged.

In the present embodiment, the power supplies 65 are disposed over the powder particles 90 and the adhesive material 91. Alternatively, the powder particles 90 and the adhesive material 91 can be disposed on the power supplies 65, or the power supplies 65 can be disposed in the powder particles 90 and the adhesive material 91.

The power supplies can be arranged crossed or in parallel to form a grid pattern 65 of FIG. 6A' or a grid pattern 65' of FIG. 6A" with gaps, thus allowing the powder particles 90 and the adhesive material 91 to pass therethrough.

Referring to FIGS. 6A, 6A' and 6A", the distance L between the receiving member 22 and the power supplies 65 is greater than the width W, W' of the gaps in the grid pattern 65, 65'. Preferably, the distance L is greater than five times the width W, W' of the gaps, i.e., L>5W or L>5W'.

Further, if the carrier 30, 40 has a plurality of through holes 300, 400, the distance D, D', D" between any two adjacent through holes 300, 400 and the width W, W' of the gaps are in a relationship of integer times. For example, W=D, 2W=D', W'=2D". Referring to FIGS. 6A' and 6A", the through holes 300, 400 are uniformly distributed in the gaps such that the same amount of the powder particles 90 and the adhesive material 91 can be vibrated through the through holes 300, 400.

During operation of the charged powder supply device 6, the objects 23 to be coated are maintained at a ground potential or a certain potential and then the action source 21 is started to vibrate the charged powder particles 90 and the adhesive material 91 on the carrier 20. Under the effect of the electric field between the power supplies 65, 65' and the objects 23 to be coated, the charged powder particles 90 and the adhesive material 91 are stuck to the objects 23 at a high speed.

Further, referring to FIG. 6B, the carrier 20 can be positively charged to generate an electric field and the powder particles 90 and the adhesive material 91 are positively charged (denoted by a plus sign in the drawing). In other embodiments, the carrier 20 can be negatively charged.

Therefore, after the action source 21 vibrates the carrier 20 so as to cause vibration of the charged powder particles 90 and the adhesive material 91, the charged powder particles 90 and the adhesive material 91 are attracted and stuck to the objects 23 by the vertical upward force (electric attraction) between the carrier 20 and the receiving member 22. Hence, the direction of the charged powder particles 90 and the adhesive material 91 can be effectively controlled to ensure the uniformity of the charged powder particles 90 on the objects 23.

Therefore, the charged powder supply device of the present invention acts on the carrier through the action source to vibrate the charged powder particles, thereby causing the charged powder particles to leave the carrier so as to be stuck to the objects. Since there are no other external forces that affect the moving direction of the charged powder particles, the present invention improves the uniformity of the charged powder particles on the objects.

Further, the charged powder supply device of the present invention provides a vibration force instead of a conventional air flow force to the charged powder particles, thereby overcoming the conventional drawback of non-uniform rising of the powder particles caused by such as turbulent flows.

The present invention is also applicable to uncharged powder particles. Therein, the uncharged powder particles and the adhesive material are stuck to objects to be coated through a vibration force. The objects to be coated can be heated objects.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A charged powder supply device, comprising:
   a carrier having opposite first and second sides, a plurality of through holes penetrating the first and second sides, a plurality of balls positioned in the through holes, and a plurality of carrying portions positioned on the first side and respectively covering one ends of the through holes, wherein the carrying portions are used for carrying a plurality of charged powder particles; and
   at least an action source positioned at the second side of the carrier for acting on the carrier so as to vibrate the charged powder particles on the first side of the carrier, thereby causing the charged powder particles to leave the first side of the carrier.

2. The device of claim 1, wherein the action source provides an impact force, a fluid motion, or an acoustic or ultrasonic wave.

3. The device of claim 1, wherein the action source is in contact with the second side of the carrier.

4. The device of claim 1, wherein the action source is separated from the second side of the carrier.

5. The device of claim 1, wherein the action source acts on the carrying portions through the balls so as to vibrate the charged powder particles.

6. The device of claim 1, wherein each of the carrying portions has a pad thereon.

7. The device of claim 6, wherein the pad is positioned in the corresponding through hole.

8. The device of claim 1, wherein the carrier further has a positioning plate on the second side thereof.

9. The device of claim 8, wherein the balls protrude from the positioning plate.

10. The device of claim 1, further comprising a receiving member positioned over and separated from the first side of the carrier for receiving the vibrated charged powder particles.

11. The device of claim 10, wherein the distance between the receiving member and the first side of the carrier is greater than the distance between any adjacent two of the through holes of the carrier.

* * * * *